United States Patent [19]

Hemmer

[11] Patent Number: 4,749,355

[45] Date of Patent: Jun. 7, 1988

[54] COAXIAL CONTACT FOR TERMINATION TO PRINTED CIRCUIT BOARDS AND THE LIKE

[75] Inventor: Valentine J. Hemmer, Unadilla, N.Y.

[73] Assignee: Amphenol Corporation, Wallingford, Conn.

[21] Appl. No.: 44,179

[22] Filed: Apr. 30, 1987

[51] Int. Cl.[4] ............................................. H05K 1/00

[52] U.S. Cl. ...................................... 439/63; 439/877; 439/675

[58] Field of Search ............... 439/578, 579, 580, 581, 439/582, 583, 584, 585, 675, 884, 891, 876, 877, 879, 882, 55, 78, 81, 82, 83, 63, 668, 669

[56] References Cited

U.S. PATENT DOCUMENTS

| | | | |
|---|---|---|---|
| 3,253,250 | 5/1966 | Harrison et al. | 439/675 |
| 3,539,976 | 11/1970 | Reynolds | 439/585 |
| 4,209,221 | 6/1980 | Chupak et al. | 439/879 |
| 4,684,200 | 8/1987 | Capp | 439/63 |

FOREIGN PATENT DOCUMENTS

| | | | |
|---|---|---|---|
| 1059673 | 3/1954 | France | 439/675 |
| 2006553 | 12/1969 | France | 439/669 |
| 955456 | 4/1964 | United Kingdom | 439/675 |

*Primary Examiner*—David Pirlot
*Attorney, Agent, or Firm*—Bacon & Thomas

[57] ABSTRACT

A coaxial contact for termination to printed circuit boards and the like includes an assembly featuring a dielectric insulator disposed within an outer contact. An outer tail is disposed within the outer contact and an inner tail is disposed within the insulator. The outer contact is staked to retain the outer tail within said contact, and to compress the insulator between the inner tail and the outer contact to retain the inner tail and the insulator within the assembly and to prevent leakage. Alternatively, adhesive joints may be used to retain the insulator within the outer assembly and the inner tail within the insulator.

3 Claims, 1 Drawing Sheet

COAXIAL CONTACT FOR TERMINATION TO PRINTED CIRCUIT BOARDS AND THE LIKE

BACKGROUND OF THE INVENTION

This invention relates generally to contacts for coaxial cables, and particularly to contacts of the type described for termination to printed circuit boards and the like.

Coaxial contacts for use with larger size electrical connectors are desirably equipped with tails for easy termination to printed circuit boards, flex print circuits, computer chips and the like, without using the coaxial cable.

It is desirable for the contact to have simplified assembly and construction characteristics; be leakproof; be capable of solder termination and withstanding high ambient temperatures without structural degradation; and be easily removable from the associated connector. A tail arrangement is advantageous for the purposes described in that the tails can be configured as pins or sockets which engage sockets or pins press fitted or soldered onto the printed circuit board and the like.

The present invention accommodates the aforenoted desirable and advantageous features.

SUMMARY OF THE INVENTION

This invention contemplates a coaxial contact for termination to printed circuit boards and the like including a dielectric insulator, an outer contact, an outer contact tail and an inner contact tail. The outer contact tail is staked within the outer contact and the insulator is disposed within said outer contact. The inner contact tail is disposed within the insulator and the outer contact is staked to compress the insulator between the inner contact tail and the outer contact to retain the inner contact tail within the insulator and to retain the insulator within the outer contact, and to seal the contact assembly against leakage. Alternatively, the insulator may be adhesively retained within the outer contact and the inner contact tail may be likewise adhesively retained within the insulator.

Accordingly, a coaxial contact for termination to printed circuit boards and the like is disclosed and claimed comprising an outer contact having a bore, a dielectric insulator concentrically disposed within the outer contact and having an aperture, an outer contact tail having a first portion which is disposed in the bore of the outer contact and a second portion extending external thereto for termination to the printed circuit board and the like, an inner contact tail having a first portion which is disposed in the aperture of the insulator and a second portion extending external the insulator and the outer contact for termination to the printed circuit board and the like, means for retaining the first portion of the outer contact tail within the outer contact bore, and means for retaining the insulator within the outer contact, and for retaining the first portion of the inner contact tail within the insulator.

DETAILED DESCRIPTION OF THE INVENTION

Figures 1, 2:
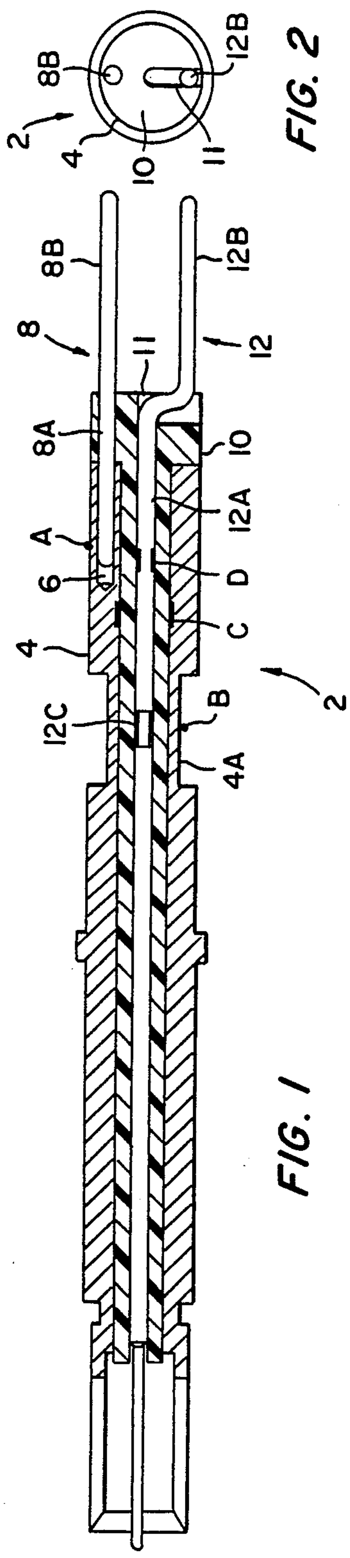
FIG. 1 is a longitudinal sectional view illustrating the coaxial contact of the invention.
FIG. 2 is a right end view thereof relative to FIG. 1.

With reference to the drawing, the coaxial contact of the invention is configured as a contact assembly designated generally by the numeral 2. Contact assembly 2 includes an outer contact 4 having a bore 6; an outer contact tail 8; an insulator 10 concentrically disposed within outer contact 4 and having an aperture 11; and an inner contact tail 12.

Outer contact 4, outer contact tail 8 and inner contact tail 12 are of a suitable metallic material. Insulator 10 is of a suitable dielectric material, such as, for purposes of example, Teflon, or a polyetherimide or polyamide-imide material.

Outer contact tail 8 is disposed within bore 6 of outer contact 4, and the outer contact is crimped or staked, as at A, to retain outer contact tail 8 within outer contact 4. Thus, outer contact tail 8 has a portion 8A which is disposed within outer contact bore 6 and a portion 8B which extends external the outer contact.

Inner contact tail 12 is bent offset so as to have a portion 12A which is disposed within aperture 11 of insulator 10 and a portion 12B which extends external insulator 10 and outer contact 4.

Outer contact 4 has an undercut 4A. Inner contact tail portion 12A has an undercut 12C within the area of outer contact undercut 4A.

Outer contact 4 is crimped or staked at undercut 4A, as at B. Upon such crimping or staking, outer contact 4 compresses insulator 10 between inner contact tail portion 12A at undercut 12C and outer contact 4 at undercut 4A to retain the insulator and inner contact tail within contact assembly 2, and for sealing the contact assembly against leakage through aperture 11, as will now be understood.

In accordance with the aforegoing description of the invention it will be seen that contact assembly 2 comprises only four components, i.e. outer contact 4, outer contact tail 8, insulator 10 and inner contact tail 12. The assembly is accomplished in a simplified manner utilizing metal staking or crimping. In this regard it will be understood that, alternatively, insulator 10 may be retained in outer contact 4 by way of a high temperature plastic adhesive joint, as at C and inner contact tail 12 may be retained within insulator aperture 11 by a like adhesive joint of epoxy or the like as a high temperature adhesive, as at D.

In any event, the assembly so described inhibits leakage through aperture 11, and tail portions 8B and 12B may be solder terminated to a printed circuit board and the like and exposed to high ambient temperatures without degradation of the assembly.

For special applications tail portions 8B and 12B may be formed as sockets (not otherwise shown) to engage pins which are press fitted or soldered onto the printed circuit board and the like. Finally, contact assembly 2 is removable from its associated electrical connector by using standard removal tools, as will now be appreciated.

With the aforegoing description of the invention in mind, reference is made to the claims appended hereto for a definition of the scope of the invention.

What is claimed is:

1. A coaxial contact for termination to printed circuit boards and the like, comprising:

an outer contact having a bore;

a dielectric insulator concentrically disposed within the outer contact, and having an aperture;

an outer contact tail having a first portion which is disposed in the bore of the outer contact and a second portion extending external thereto for termination to the printed circuit board and the like;

an inner contact tail having a first portion which is disposed in the aperture of the insulator and a second portion extending external of the insulator and the outer contact for termination to the printed circuit board and the like;

means for retaining the first portion of the outer contact tail within the outer contact bore; and means for retaining the insulator within the outer contact, and for retaining the first portion of the inner contact tail within the insulator wherein the means for retaining the insulator within the outer contact, and for retaining the first portion of the inner contact tail within the insulator includes:

the outer contact having an undercut;

the first portion of the inner contact tail having an undercut within the undercut of the outer contact; and a stake within the outer contact undercut, said stake being effective for compressing the insulator between the first portion of the inner contact tail and the outer contact to retain the insulator within the outer contact and to retain the inner contact tail within the insulator.

2. A coaxial contact for termination to printed circuit boards and the like, comprising:

an outer contact having a bore;

a dielectric insulator concentrically disposed within the outer contact, and having an aperture;

an outer contact tail having a first portion which is disposed in the bore of the outer contact and a second portion extending external thereto for termination to the printed circuit board and the like;

an inner contact tail having a first portion which is disposed in the aperture of the insulator and a second portion extending external of the insulator and the outer contact for termination to the printed circuit board and the like;

means for retaining the first portion of the outer contact tail within the outer contact bore; and means for retaining the insulator within the outer contact, and for retaining the first portion of the inner contact tail within the insulator wherein the means for retaining the first portion of the outer contact tail within the outer contact bore includes:

a stake on the outer contact, said stake being effective for retaining the first portion of the outer contact tail within the outer contact, and wherein the means for retaining the insulator within the outer contact, and for retaining the first portion of the inner contact tail within the insulator includes:

the outer contact having an undercut;

the first portion of the inner contact tail having an undercut within the undercut of the outer contact; and a stake within the outer contact undercut, said stake being effective for compressing the insulator between the first portion of the inner contact tail and the outer contact to retain the insulator within the outer contact and to retain the inner contact tail within the insulator.

3. A coaxial contact as described by claim 2, wherein:

the first portion of the inner contact tail which is disposed in the aperture of the insulator is axially offset from the second portion thereof extending external of the insulator and the outer contact.

* * * * *